(12) United States Patent
Liu

(10) Patent No.: US 11,942,161 B2
(45) Date of Patent: Mar. 26, 2024

(54) SECURE MEMORY DEVICE AND ERASE METHOD THEREOF

(71) Applicant: Nuvoton Technology Corporation, Hsinchu Science Park (TW)

(72) Inventor: Tse-Yen Liu, Taipei (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 36 days.

(21) Appl. No.: 17/560,488

(22) Filed: Dec. 23, 2021

(65) Prior Publication Data
US 2023/0162800 A1    May 25, 2023

(30) Foreign Application Priority Data
Nov. 25, 2021 (CN) .......................... 202111414402.2

(51) Int. Cl.
*G11C 16/16*    (2006.01)
*G11C 16/10*    (2006.01)
*G11C 16/32*    (2006.01)
*H03K 19/20*    (2006.01)

(52) U.S. Cl.
CPC ............ *G11C 16/16* (2013.01); *G11C 16/102* (2013.01); *G11C 16/32* (2013.01); *H03K 19/20* (2013.01)

(58) Field of Classification Search
CPC ........ G11C 16/16; G11C 16/102; G11C 16/32; H03K 19/20
See application file for complete search history.

(56) References Cited

U.S. PATENT DOCUMENTS 5,774,399 A * 6/1998 Kwon .................... G11C 16/30
365/185.29
2001/0000816 A1    5/2001 Baltar

FOREIGN PATENT DOCUMENTS

| CN | 101496109 A | 7/2009 |
| CN | 110825319 A | 2/2020 |
| TW |    501138 B | 9/2002 |
| TW | 201935487 A | 9/2019 |

* cited by examiner

*Primary Examiner* — Jay W. Radke
(74) *Attorney, Agent, or Firm* — Muncy, Geissler, Olds & Lowe, P.C.

(57) ABSTRACT

A memory device includes a main memory, a first sub-memory and a controller. When the first sub-memory is erased, the first sub-memory generates a first erase completion signal. The controller receives an erase signal to erase the main memory. The controller performs an erase operation on the main memory according to the erase signal and the first erase completion signal.

10 Claims, 4 Drawing Sheets

400

SECURE MEMORY DEVICE AND ERASE METHOD THEREOF

CROSS REFERENCE TO RELATED APPLICATIONS

This Application claims priority of China Patent Application No. 202111414402.2, filed on Nov. 25, 2021, the entirety of which is incorporated by reference herein.

BACKGROUND OF THE INVENTION

Field of the Invention

The present invention relates to a memory device and an erase method thereof, and more particularly it relates to a secure memory device and an erase method thereof.

Description of the Related Art

In the era of the Internet of Things, in order to prevent data in a device from being stolen by unauthorized personnel, more and more equipment manufacturers are using secure chips as development tools. The practice of storing programs and data in a secure memory device inside the chips has gradually attracted the attention and favor of the market.

With the increase in equipment application complexity, the memory capacity of the chip as a development tool for internal data storage must increase as well. In view of this, many chip designers have begun to try to place more than one memory unit inside the chip so that the data in each memory can be protected by security functions and facilitate unified control. Chip designers often use a main memory to be responsible for switching the security functions of itself and each sub-memory.

However, when the user clears the security functions, how should the chip designer ensure that the memory data of each block is not accidentally exposed, so as to avoid problems of data security? Therefore, it is necessary to optimize the memory erase procedure for the security of the memory.

BRIEF SUMMARY OF THE INVENTION

Secure memory devices and erase methods thereof are provided herein. Since the security control signals of sub-memories in a memory device are stored in the main memory, the sub-memories need to be erased prior to the main memory when the main memory needs to be erased, so as to prevent the sub-memories from entering an unlocked state after the main memory is erased, leading to the secure data in the memory being exposed.

In an embodiment, a memory device comprises a main memory, a first sub-memory, and a controller. In response to the first sub-memory being erased, the first sub-memory outputs an enabled first erase completion signal. The controller receives an erase signal to erase the main memory. The controller performs an erase operation on the main memory according to the erase signal and the first erase completion signal.

According to an embodiment of the invention, the memory device further comprises a second sub-memory. When the second sub-memory is erased, the second sub-memory outputs an enable second erase completion signal. The controller performs the erase operation on the main memory according to the erase signal, the first erase completion signal, and the second erase completion signal.

According to an embodiment of the invention, when the first sub-memory does not generate the enabled first erase completion signal and/or the second sub-memory does not generate the enabled second erase completion signal, the controller does not perform the erase operation on the main memory.

According to an embodiment of the invention, the memory device further comprises a security register. The security register stores a first security control signal and a second security control signal. The first sub-memory operates in a locked state according to the first security control signal and the second sub-memory operates in the locked state according to the second security control signal. When the controller completes an initialization procedure, the controller writes the first security control signal and the second security control signal from the main memory to the security register. In response to the first sub-memory and/or the second sub-memory being erased, the first sub-memory and/or the second sub-memory operate(s) in an unlocked state according to the first security control signal and/or the second security control signal.

According to an embodiment of the invention, either one of the first sub-memory and the second sub-memory further comprises a multiplexer and a flip-flop. The multiplexer selects either one of a first sub erase control signal and the first erase completion signal for use as an intermediate signal according to the first security control signal, or selects either one of a second sub erase control signal and the second erase completion signal for use as the intermediate signal according to the second security control signal. The flip-flop outputs the intermediate signal for use as the first erase completion signal according to a clock signal, or outputs the intermediate signal for use as the second erase completion signal according to the clock signal.

According to an embodiment of the invention, when the controller receives the first sub erase control signal to erase the first sub-memory and/or receives the second sub erase control signal to erase the second sub-memory, the controller operates the first sub-memory and/or the second sub-memory in an unlocked state by the first security control signal and/or the second security control signal, and the multiplexers of the first sub-memory and the second sub-memory generate the first erase completion signal and the second erase completion signal respectively.

According to an embodiment of the invention, the controller comprises an AND gate. The AND gate receives the erase signal, the first erase completion signal, and the second erase completion signal to generate an enable signal. When the erase signal, the first erase completion signal, and the second erase completion signal are all at a first logic level, the enable signal output by the AND gate is at the first logic level. The controller performs the erase operation on the main memory in response to the enable signal.

In another embodiment, an erase method adapted to a memory device is provided. The memory device comprises a main memory and a first sub-memory. The erase method comprises receiving an erase signal to erase the main memory; determining whether the first sub-memory is erased; in response to determining the first sub-memory is erased, performing an erase operation on the main memory; and in response to determining the first sub-memory is not erased, not performing the erase operation on the main memory.

According to an embodiment of the invention, the memory device further comprises a second sub-memory, wherein the erase method further comprises determining whether the second sub-memory is erased; in response to determining the first sub-memory and the second sub-memory are both erased, performing the erase operation on the main memory; and in response to determining the first sub-memory and/or the second sub-memory is not erased, not performing the erase operation on the main memory.

According to an embodiment of the invention, the memory device further comprises a security register configured to store a first security control signal and a second security control signal. The first sub-memory and the second sub-memory respectively operate in a locked state according to the first security control signal and the second security control signal. When the memory device completes an initialization procedure, the first security control signal and the second security control signal are written from the main memory to the security register. When the first sub-memory and/or the second sub-memory is/are erased, the first sub-memory and/or the second sub-memory operate(s) in an unlocked state according to the first security control signal and/or the second security control signal respectively.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
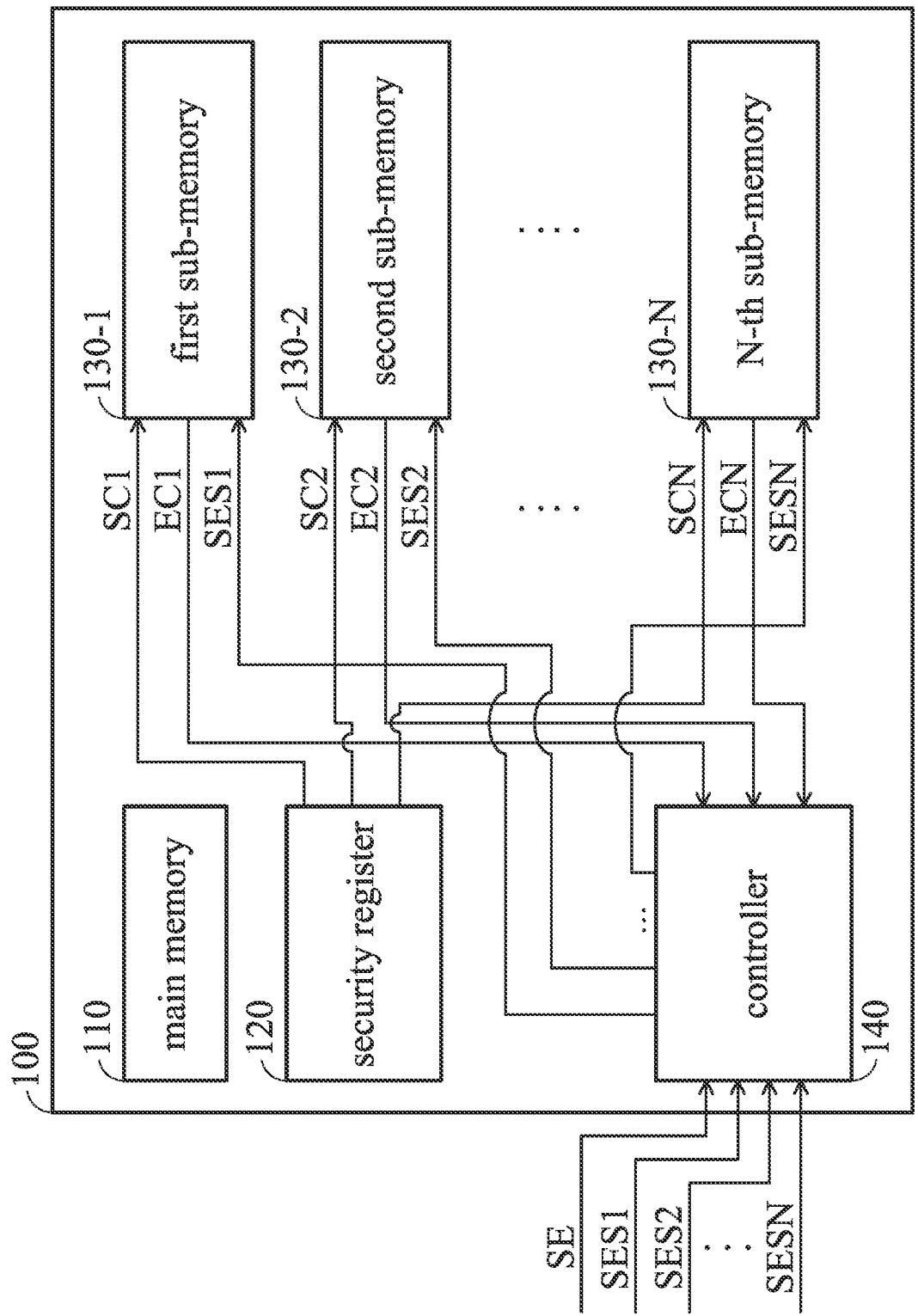
FIG. 1 shows a block diagram of a memory device in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that, in the description herein and throughout the claims that follow, although the terms "first," "second," etc. may be used to describe various elements, these elements should not be limited by these terms. These terms are only used to distinguish one element from another. For example, a first element could be termed a second element, and, similarly, a second element could be termed a first element, without departing from the scope of the embodiments.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 shows a block diagram of a memory device in accordance with an embodiment of the invention. As shown in FIG. 1, the memory device 100 includes a main memory 110, a security register 120, a first sub-memory 130-1, a second sub-memory 130-2 . . . , an N-th sub-memory 130-N, and a controller 140. According to an embodiment of the invention, the main memory 110 is configured to store the security control signals of the main memory 110, the first sub-memory 130-1, the second sub-memory 130-2 . . . , and the N-th sub-memory 130-N.

The security register 120 is configured to store a first security control signal SC1, a second security control signal SC2 . . . , and an N-th security control signal SCN for controlling the first sub-memory 130-1, the second sub-memory 130-2 . . . , and the N-th sub-memory 130-N respectively. According to an embodiment of the invention, when the controller 140 completes the initialization procedure, the controller 140 writes the first security control signal SC1, the second security control signal SC2 . . . , and the N-th security control signal SCN from the main memory 110 to the security register 120. In addition, the controller 140 respectively controls the security of the first sub-memory 130-1, the second sub-memory 130-2 . . . , and the N-th sub-memory 130-N by the first security control signal SC1, the second security control signal SC2 . . . , and the N-th security control signal SCN stored in the safety register 120. According to an embodiment of the invention, as shown in FIG. 1, the security register 120 is coupled to the first sub-memory 130-1, the second sub-memory 130-2 . . . , and the N-th sub-memory 130-N.

According to an embodiment of the invention, when any one of the first security control signal SC1, the second security control signal SC2 . . . , and the N-th security control signal SCN is at the first logic level, the corresponding one(s) of the first sub-memory 130-1, the second sub-memory 130-2 . . . , or the N-th sub-memory 130-N is/are operated in a locked state, so that the controller 140 cannot perform the erase operation on the corresponding one(s) of the first sub-memory 130-1, the second sub-memory 130-2 . . . , and 130-N. The secure data stored in the first sub-memory 130-1, the second sub-memory 130-2 . . . , and the N-th sub-memory 130-N is thus protected.

According to another embodiment of the present invention, when any one of the first security control signal SC1, the second security control signal SC2 . . . , and the N-th security control signal SCN is at the second logic level, the first sub-memory 130-1, the corresponding one(s) of the second sub-memory 130-2 . . . , and the N-th sub-memory 130-N is/are operated in the unlocked state, so that the controller 140 can perform the erase operation on the corresponding one(s) of the first sub-memory 130-1, the second sub-memory 130-2 . . . , and the N-th sub-memory 130-N. The data stored in the first sub-memory 130-1, the second sub-memory 130-2 . . . , and the N-th sub-memory 130-N is thus not protected.

In response to any one of the first sub-memory 130-1, the second sub-memory 130-2 . . . , and the N-th sub-memory 130-N completing the erase operation, the first sub-memory 130-1, the second sub-memory 130-2 . . . , and the N-th sub-memory 130-N respectively generate an enabled first erase completion signal EC1, an enabled second erase completion signal EC2, . . . and an enabled N-th erase completion signal ECN. In addition, the first sub-memory 130-1, the second sub-memory 130-2 . . . , and the N-th sub-memory 130-N respectively send the first erase completion signal EC1, the second erase completion signal EC2 . . . , and the N-th erase completion signal ECN to the controller 140.

The controller 140 receives the erase signal SE, the first sub erase signal SES1, the second sub erase signal SES2 . . . , the N-th sub erase signal SESN, the first erase completion signal EC1, the second erase completion signal EC2 . . . , and the N-th erase completion signal ECN to perform the corresponding erase operation, where the enabled erase signal SE is configured to erase the main memory 110, and the enabled first sub erase signal SES1, the enabled second sub erase signal SES2, . . . and the enabled N-th sub erase signal SESN are configured to erase the first sub-memory 130-1, the second sub-memory 130-2 . . . , and the N-th sub-memory 130-N respectively. The controller 140 further provides the first sub erase signal SES1, the second sub erase signal SES2 . . . , and the N-th sub erase signal SESN to the first sub-memory 130-1, the second sub-memory 130-2 . . . , and the N-th sub-memory 130-N respectively. According to an embodiment of the invention, the controller 140 performs the erase operation on the main memory 110 according to the erase signal SE, the first erase completion signal EC1, the second erase completion signal EC2 . . . , and the N-th erase completion signal ECN.

In other words, in response to any one of the first sub-memory 130-1, the second sub-memory 130-2 . . . , and the N-th sub-memory 130-N not completing the erase operation, the controller 140 does not perform the erase operation on the main memory 110 until the first sub-memory 130-1, the second sub-memory 130-2 . . . , and the N-th sub-memory 130-N are all erased.

The first security control signal SC1, the second security control signal SC2 . . . and the N-th security control signal SCN of the first sub-memory 130-1, the second sub-memory 130-2 . . . , and the N-th sub-memory 130-N are stored in the main memory 110. If the main memory 110 is erased before the first sub-memory 130-1, the second sub-memory 130-2 . . . , and the N-th sub-memory 130-N are cleared, the first sub-memory 130-1, the second sub-memory 130-2 . . . , and the N-th sub-memory 130-N will be forced to enter the unlocked state, thereby exposing the stored data.

Figure 2:
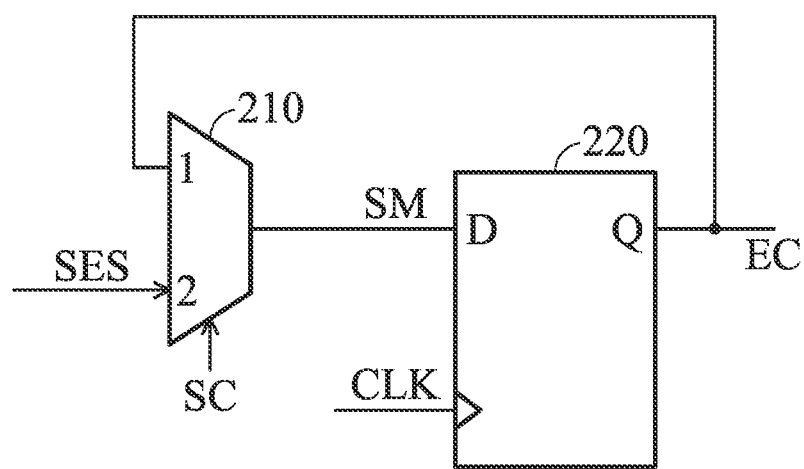
FIG. 2 shows a schematic diagram of a circuit unit in accordance with an embodiment of the invention.

FIG. 2 shows a schematic diagram of a circuit unit in accordance with an embodiment of the invention. According to an embodiment of the invention, the circuit unit 200 is located in each of the first sub-memory 130-1, the second sub-memory 130-2 . . . , and the N-th sub-memory 130-N in FIG. 1.

As shown in FIG. 2, the circuit unit 200 includes a multiplexer 210 and a flip-flop 220. The multiplexer 210 selects either one of the sub erase control signal SES and the erase completion signal EC for use as the intermediate signal SM according to the security control signal SC. According to an embodiment of the invention, the security control signal SC corresponds to one of the first security control signal SC1, the second security control signal SC2 . . . , and the N-th security control signal SCN in FIG. 1, and the sub erase control signal SES corresponds to the first sub erase control signal SES1, the second sub erase control signal SES2 . . . , and the N-th sub erase control signal SESN in FIG. 1. The flip-flop 220 outputs the intermediate signal SM as the erase completion signal EC according to the clock signal CLK, where the erase completion signal EC corresponds to the first erase completion signal EC1, the second erase completion signal EC2 . . . , and the N-th erase completion signal ECN.

For example, when the N-th sub-memory 130-N is operated in the locked state according to the N-th security control signal SCN (corresponding to the security control signal SC shown in FIG. 2) at the first logic level, the multiplexer 210 selects the N-th erase completion signal ECN (corresponding to the erase completion signal EC shown in FIG. 2) for use as an intermediate signal SM according to the N-th security control signal SCN (corresponding to the security control signal SC shown in FIG. 2). In other words, the flip-flop 220 latches the N-th erase completion signal ECN (corresponding to the erase completion signal EC shown in FIG. 2), so as to keep the N-th erase completion signal ECN (corresponding to the erase completion signal EC shown in FIG. 2) at the same logic level.

For example, when the N-th sub-memory 130-N is operated in the unlocked state according to the N-th security control signal SCN (corresponding to the security control signal SC shown in FIG. 2) at the second logic level and erased according to the N-th sub erase control signal SESN at the high logic level (corresponding to the sub erase control signal SES shown in FIG. 2), the multiplexer 210 selects the N-th sub erase control signal SESN (corresponding to the sub erase control signal SES shown in FIG. 2) as the intermediate signal SM according to the N-th security control signal SCN (corresponding to the security control signal SC as shown in FIG. 2), so the flip-flop 220 outputs the N-th sub erase control signal SESN (corresponding to the sub erase control signal SES shown in FIG. 2) as the N-th erase completion signal ECN (corresponding to the erase completion signal EC shown in FIG. 2).

Figure 3:
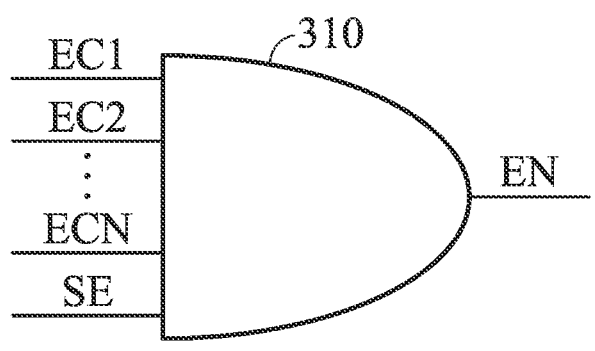
FIG. 3 shows a schematic diagram of a circuit unit in accordance with an embodiment of the invention.

FIG. 3 shows a schematic diagram of a circuit unit in accordance with an embodiment of the invention. As shown in FIG. 3, the circuit unit 300 includes an AND gate 310. According to an embodiment of the invention, the circuit unit 300 is deposited in the controller 140. The AND gate 310 receives the erase signal SE, the first erase completion signal EC1, the second erase completion signal EC2 . . . , and the N-th erase completion signal ECN to perform logic operations to generate an enable signal EN. In response to the erase signal SE, the first erase completion signal EC1, the second erase completion signal EC2 . . . , and the N-th erase completion signal ECN being all at the high logic level, the enable signal EN output by the AND gate 310 is at the high logic level, where the controller 140 erases the main memory 110 in response to the enable signal EN at the high logic level.

According to an embodiment of the invention, when the enable signal EN is at the high logic level, it indicates that the erase operations of the first sub-memory 130-1, the second sub-memory 130-2 . . . , and the N-th sub-memory 130-N have both been completed, and the erase signal SE for erasing the main memory 110 has also been received. The AND gate 310 thus generates the enable signal EN at the high logic level. The controller 140 erases the main memory 110 in response to the enable signal EN at the high logic level, which ensures that the main memory 110 is not erased before any one of the first sub-memory 130-1, the second sub-memory 130-2 . . . , and the N-th sub-memory 130-N has not completed the erase operation. Therefore, the security control signals of the first sub-memory 130-1, the second sub-memory 130-2 . . . , and the first sub-memory 130-N are retained.

Figure 4:
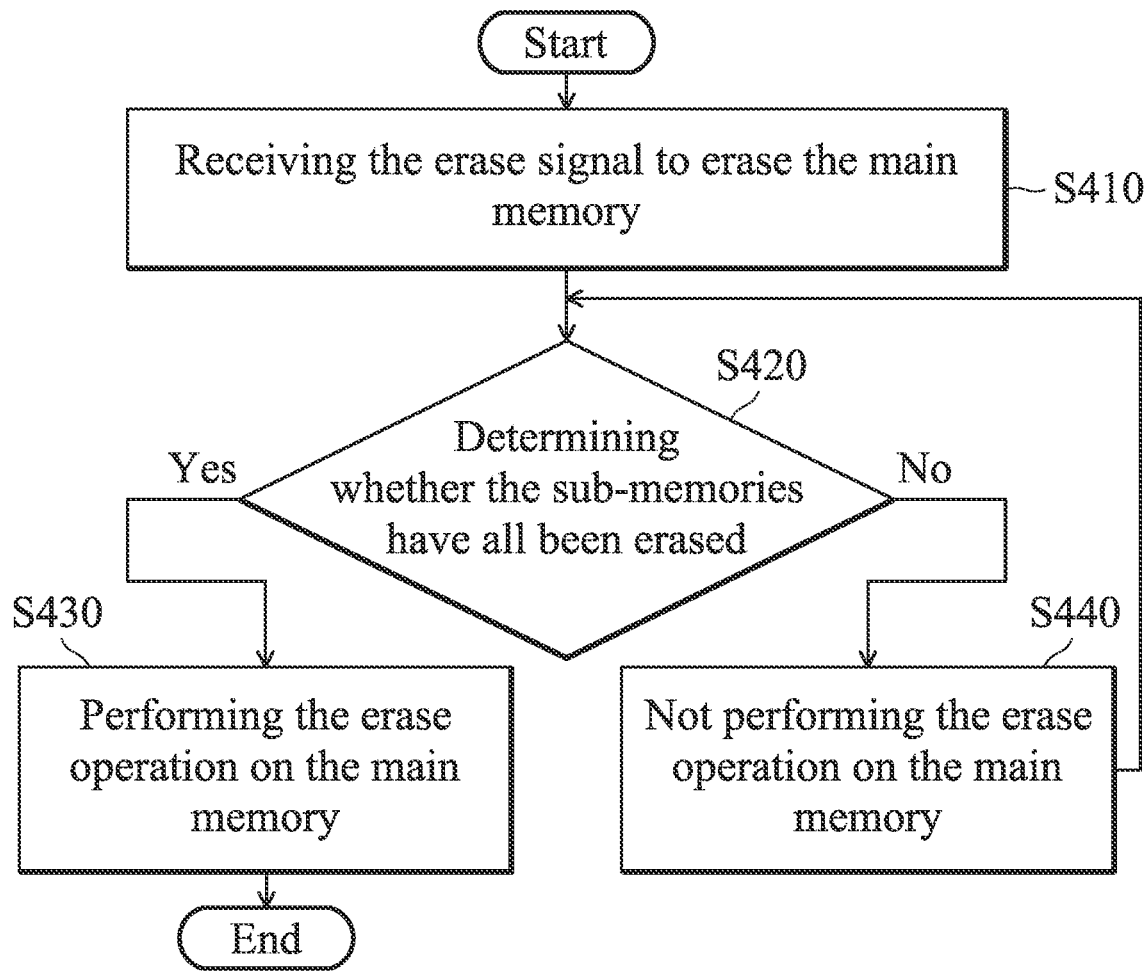
FIG. 4 shows a flow chart of an erase method in accordance with an embodiment of the invention.

FIG. 4 shows a flow chart of an erase method in accordance with an embodiment of the invention. The following description of the flow chart shown in FIG. 4 will be combined with the block diagram in FIG. 1 for detailed description.

As shown in the erase method 400 shown in FIG. 4, the erase signal SE is received to erase the main memory 110 (step S410). It is determined whether the first sub-memory 130-1, the second sub-memory 130-2 . . . , and the N-th sub-memory 130-N have all been erased (step S420). According to an embodiment of the invention, as shown in FIG. 3, the enable signal EN of the AND gate 310 is configured to determine whether the first sub-memory 130-1, the second sub-memory 130-2 . . . , and the N-th sub-memory 130-N have all been erased.

In response to determining that the first sub-memory 130-1, the second sub-memory 130-2 . . . , and the N-th sub-memory 130-N are all erased, the erase operation is performed on the main memory 110 (step S430). More specifically, the AND gate 310 in FIG. 3 determines whether the erase signal SE, the first erase completion signal EC1, the second erase completion signal EC2 . . . , and the N-th erase completion signal ECN are all at the high logic level. In response to the erase signal SE, the first erase completion signal EC1, the second erase completion signal EC2 . . . , and the N-th erase completion signal ECN being all at the high logic level, it indicates that the main memory 110 can be erased.

In response to determining that any one of the first sub-memory 130-1, the second sub-memory 130-2 . . . , and the N-th sub-memory 130-N has not been erased, the erase operation is not performed on the main memory 110 (Step S440), and step S420 is repeated until the first sub-memory 130-1, the second sub-memory 130-2 . . . , and the N-th sub-memory 130-N are all erased. In response to determining that the first sub-memory 130-1, the second sub-memory 130-2 . . . , and the N-th sub-memory 130-N are all erased, the erase operation can be performed on the main memory 110.

Secure memory devices and erase methods thereof are provided herein. Since the security control signals of the sub-memories in the memory device are stored in the main memory, the sub-memories need to be erased prior to the main memory when the main memory needs to be erased, so as to prevent the sub-memories from entering an unlocked state after the main memory is erased, leading to the secure data in the memory being exposed.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory device, comprising:
a main memory, storing a first security control signal;
a first sub-memory, wherein in response to the first sub-memory being erased, the first sub-memory outputs an enabled first erase completion signal, wherein the first sub-memory operates in a locked state according to the first security control signal; and
a controller, receiving an erase signal to erase the main memory, wherein the controller performs an erase operation on the main memory according to the erase signal and the first erase completion signal.

2. The memory device as defined in claim 1, further comprising:
a second sub-memory, wherein in response to the second sub-memory being erased, the second sub-memory outputs an enabled second erase completion signal, wherein the main memory further stores a second security control signal, wherein the controller performs the erase operation on the main memory according to the erase signal, the first erase completion signal, and the second erase completion signal.

3. The memory device as defined in claim 2, wherein when the first sub-memory does not generate the enabled first erase completion signal and/or the second sub-memory does not generate the second erase completion signal, the controller does not perform the erase operation on the main memory.

4. The memory device as defined in claim 3, wherein the controller comprises:
an AND gate, receiving the erase signal, the first erase completion signal, and the second erase completion signal to generate an enable signal, wherein when the erase signal, the first erase completion signal, and the second erase completion signal are all at a first logic level, the enable signal output by the AND gate is at the first logic level, wherein the controller performs the erase operation on the main memory in response to the enable signal.

5. The memory device as defined in claim 1, further comprising:
a security register, storing the first security control security control signal and the second security control signal, wherein the second sub-memory operates in the locked state according to the second security control signal, wherein when the controller completes an initialization procedure, the controller writes the first security control signal and the second security control from the main memory to the security register, wherein in response to the first sub-memory and/or the second sub-memory-being erased, the first sub-memory and/or the second sub-memory operate(s) in an unlocked state according to the first security control signal and/or the second security control signal.

6. The memory device as defined in claim 5, wherein either one of the first sub-memory and the second sub-memory further comprises:
a multiplexer, selecting either one of a first sub erase control signal and the first erase completion signal for use as an intermediate signal according to the first-security control signal, or selecting either one of a second sub erase control signal and the second erase completion signal for use as the intermediate signal according to the second security control signal; and a flip-flop, outputting the intermediate signal for use as the first erase completion signal according to a clock signal, or outputting the intermediate signal for use as the second erase completion signal according to the clock signal.

7. The memory device as defined in claim 6, wherein when the controller receives the first sub erase control signal to erase the first sub-memory and/or receives the second sub erase control signal to erase the second sub-memory, the controller operates the first sub-memory and/or the second sub-memory in an unlocked state by the first security control signal and/or the second security control signal, and the multiplexers of the first sub-memory and the second sub-memory generate the first erase completion signal and the second erase completion signal respectively.

8. An erase method adapted to a memory device, wherein the memory device comprises a main memory and a first sub-memory, wherein the main memory stores a first security control signal, wherein the first sub-memory operates in a locked state according to the first security control signal, wherein the erase method comprises:
  receiving an erase signal to erase the main memory;
  determining whether the first sub-memory is erased;
  in response to determining the first sub-memory is erased, performing an erase operation on the main memory; and
  in response to determining the first sub-memory is not erased, not performing the erase operation on the main memory.

9. The erase method as defined in claim 8, wherein the memory device further comprises a second sub-memory, wherein the main memory stores a second security control signal, wherein the second sub-memory operates in the locked state according to the second security control signal, wherein the erase method further comprises:
  determining whether the second sub-memory is erased;
  in response to determining the first sub-memory and the second sub-memory are both erased, performing the erase operation on the main memory; and
  in response to determining the first sub-memory and/or the second sub-memory is not erased, not performing the erase operation on the main memory.

10. The erase method as defined in claim 8, wherein the memory device further comprises a security register configured to store a first security control signal and a second security control signal, wherein the first sub-memory and the second sub-memory respectively operate in a locked state according to the first security control signal and the second security control signal, wherein when the memory device completes an initialization procedure, the first security control signal and the second security control signal are written from the main memory to the security register, wherein when the first sub-memory and/or the second sub-memory is/are erased, the first sub-memory and/or the second sub-memory operate(s) in an unlocked state according to the first security control signal and/or the second security control signal respectively.

* * * * *